United States Patent
Roy et al.

(10) Patent No.: US 11,462,438 B2
(45) Date of Patent: Oct. 4, 2022

(54) VOLUMETRIC EXPANSION OF METAL-CONTAINING FILMS BY SILICIDATION

(71) Applicant: Applied Materials, Inc., Santa Clara, CA (US)

(72) Inventors: Susmit Singha Roy, Sunnyvale, CA (US); Srinivas Gandikota, Santa Clara, CA (US); Abhijit Basu Mallick, Palo Alto, CA (US); Amrita B. Mullick, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 53 days.

(21) Appl. No.: 16/647,310

(22) PCT Filed: Sep. 14, 2018

(86) PCT No.: PCT/US2018/051035
§ 371 (c)(1),
(2) Date: Mar. 13, 2020

(87) PCT Pub. No.: WO2019/055759
PCT Pub. Date: Mar. 21, 2019

(65) Prior Publication Data
US 2020/0279772 A1    Sep. 3, 2020

Related U.S. Application Data

(60) Provisional application No. 62/559,547, filed on Sep. 16, 2017.

(51) Int. Cl.
*H01L 21/768*    (2006.01)
*C23C 16/04*    (2006.01)
(Continued)

(52) U.S. Cl.
CPC ...... *H01L 21/76897* (2013.01); *C23C 16/042* (2013.01); *C23C 16/42* (2013.01);
(Continued)

(58) Field of Classification Search
CPC ......... H01L 21/76897; H01L 21/76889; H01L 21/76877; H01L 21/76816;
(Continued)

(56) References Cited

U.S. PATENT DOCUMENTS 9,362,165 B1    6/2016    Bouche et al.
2002/0001892 A1*    1/2002    Kim ............... H01L 21/76897
                                                                438/197

(Continued)

OTHER PUBLICATIONS

PCT International Search Report and Written Opinion in PCT/US2018/051035 dated Jan. 3, 2019, 11 pages.

*Primary Examiner* — Thanhha S Pham
(74) *Attorney, Agent, or Firm* — Servilla Whitney LLC

(57) ABSTRACT

Methods of producing a self-aligned structure are described. The methods comprise forming a metal-containing film in a substrate feature and silicidizing the metal-containing film to form a self-aligned structure comprising metal silicide. In some embodiments, the rate of formation of the self-aligned structure is controlled. In some embodiments, the amount of volumetric expansion of the metal-containing film to form the self-aligned structure is controlled. Methods of forming self-aligned vias are also described.

19 Claims, 2 Drawing Sheets

(51) Int. Cl.
  *C23C 16/42*   (2006.01)
  *C23C 16/44*   (2006.01)
  *C23C 16/56*   (2006.01)

(52) U.S. Cl.
  CPC .............. *C23C 16/44* (2013.01); *C23C 16/56* (2013.01); *H01L 21/76889* (2013.01)

(58) Field of Classification Search
  CPC ......... H01L 21/02208; H01L 21/76868; H01L 21/0274; C23C 16/042; C23C 16/42; C23C 16/44; C23C 16/56
  See application file for complete search history.

(56) References Cited

U.S. PATENT DOCUMENTS

2002/0163081 A1    11/2002  Aoyama
2009/0283913 A1*   11/2009  Hayashi ............ H01L 21/76877
                                                              257/762
2012/0156857 A1     6/2012  Cohen
2016/0141416 A1     5/2016  Mariani et al.
2016/0163587 A1     6/2016  Backes et al.

* cited by examiner

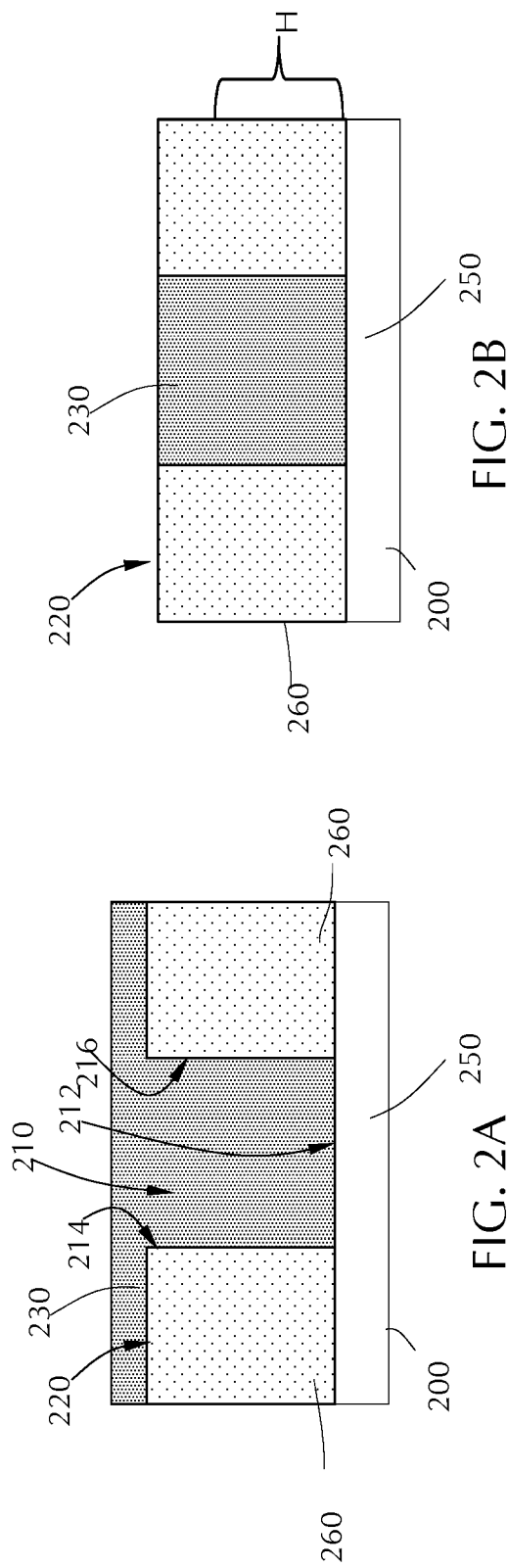
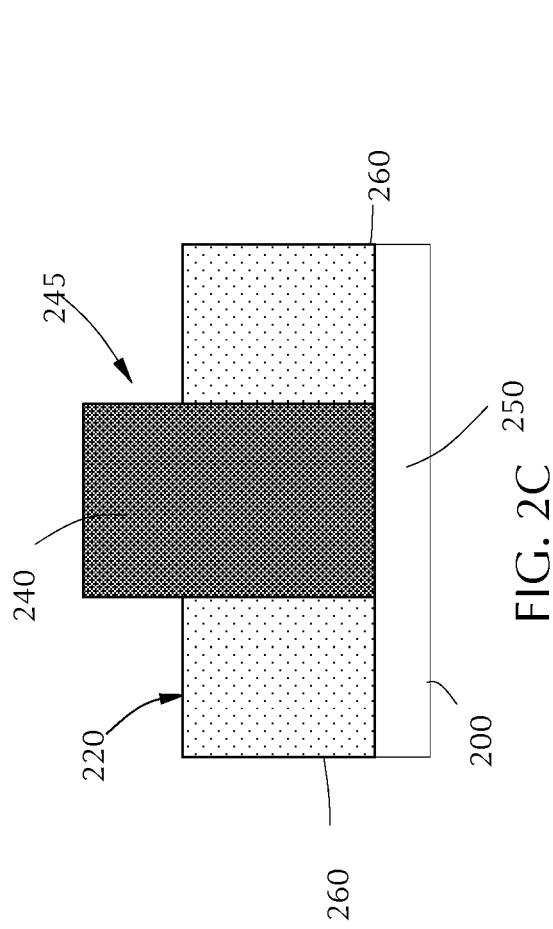

VOLUMETRIC EXPANSION OF METAL-CONTAINING FILMS BY SILICIDATION

CROSS-REFERENCE TO RELATED APPLICATIONS

This application is the National Stage entry of PCT/US2018/051035, filed on Sep. 14, 2018, which claims priority to United States Provisional Application. Ser. No. 62/559,547, filed Sep. 16, 2017, the entire disclosures of which are hereby incorporated by reference herein.

TECHNICAL FIELD

The present disclosure relates generally to methods of depositing and processing thin films. In particular, the disclosure relates to processes for producing self-aligned structures.

BACKGROUND

Self-aligned metal oxide pillars can be formed through the oxidation of gap-filled metal films. Metal is deposited on the structure of holes or trenches and then oxidized to form metal oxides. The volume expansion during oxidization pushes a pillar out of the holes or trenches. The pillars are selectively grown from the bottom-up from metal only.

However, there are some challenges of using this process because of the rate and amount of volume expansion of the metal to form the metal oxide columns. First, rapid changes in stress sometimes lead to degradation of the inherent structure. This can lead to bending of tall columns when the CD is small. Second, rapid change in the volume sometimes leads to adhesion issues between the metal oxide pillar and the substrate. Third, residual, un-oxidized, metal often remains at the bottom of the trench.

There is a need in the art for alternative methods to create self-aligned structures. More specifically, there is a need in the art for alternative methods to create self-aligned columns and structures which afford a slower rate of formation and quantity of expansion.

SUMMARY

One or more embodiments of the disclosure are directed to methods for producing self-aligned structures. The methods comprise providing a substrate with a substrate surface with at least one feature formed therein. The at least one feature extends a distance into the substrate from the substrate surface and has a sidewall and bottom. A metal-containing film is formed in the at least one feature and not outside the at least one feature. The metal-containing film is exposed to a silicon precursor to form a self-aligned structure of metal silicide that expands from the at least one feature.

Additional embodiments of the disclosure are directed to methods for producing a self-aligned structure. The methods comprise providing a substrate with a substrate surface with at least one feature formed therein. The at least one feature extends a distance into the substrate from the substrate surface and has a sidewall and bottom. A tungsten film is formed on the substrate surface and in the at least one feature. The tungsten film is removed from the substrate surface outside of the at least one feature. The tungsten film is exposed to a silicon precursor and hydrogen to form a self-aligned structure of tungsten silicide that expands from the at least one feature at a predetermined rate. The self-aligned structure has a volume of about two times the tungsten film within the feature.

Further embodiments of the disclosure are directed to methods for producing a self-aligned via. The methods comprise providing a substrate with a substrate surface with at least one feature formed therein. The at least one feature extending a distance into the substrate from the substrate surface and having a sidewall and bottom. A tungsten film is formed on the substrate surface and in the at least one feature. The tungsten film is removed from the substrate surface outside of the at least one feature. The tungsten film is exposed to a silicon precursor to form a self-aligned structure of tungsten silicide that expands from the at least one feature at a predetermined rate. A material is deposited around the self-aligned structure. The self-aligned structure is exposed to a hydrogen plasma and a metal fluoride etchant to remove the self-aligned structure and form a self-aligned via.

BRIEF DESCRIPTION OF THE DRAWINGS

So that the manner in which the above recited features of the present disclosure can be understood in detail, a more particular description of the disclosure, briefly summarized herein, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2A through 2C show a cross-sectional schematic of a self-aligned structure formation process in accordance with one or more embodiments of the disclosure.

DETAILED DESCRIPTION

Figure 1:
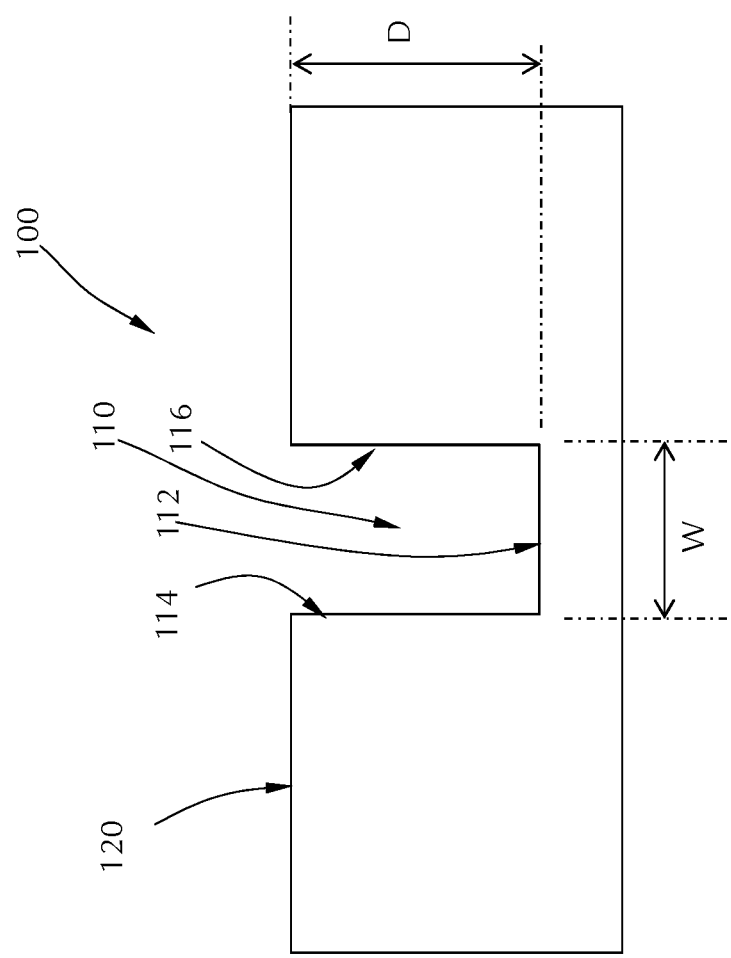
FIG. 1 shows a cross-sectional view of a substrate feature in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods for forming self-aligned structures. Embodiments of the disclosure advantageously provide methods of forming self-aligned structures from a metal-containing film at a controlled rate and/or with a controlled amount of volumetric expansion. Some embodiments of the disclosure advantageously provide methods of removing a self-aligned structure to produce a self-aligned via.

One or more embodiments of the disclosure provide methods for producing self-aligned structures which are produced more slowly and/or have less volumetric expansion. Without being bound by theory, these embodiments provide for structures which demonstrate better adhesion to the substrate and growth which is straight up from the substrate.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. In specific embodiments, the feature 110 is a trench. As used in this regard, the term "feature" means any intentional surface irregularity. Suitable examples of features include, but are not limited to trenches which have a top, two sidewalls and a bottom, valleys which have a top, two sidewalls without a separate bottom, and vias which have sidewalls extending down from a surface with an open bottom. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a top surface 120. The at least one feature 110 forms an opening in the top surface 120. The feature 110 extends from the top surface 120 to a depth D to a bottom surface 112. The feature 110 has a first sidewall 114 and a second sidewall 116 that define a width W of the feature 110. The open area formed by the sidewalls and bottom are also referred to as a gap.

With reference to FIGS. 2A through 2C, a substrate 200 is provided for processing. The substrate 200 is similar to the substrate 100 shown in FIG. 1. As used in this regard, the term "provided" means that the substrate is placed into a position or environment for further processing. The substrate 200 illustrated in FIG. 2A has a first surface material 250 and a second surface material 260. The first surface material 250 and the second surface material 260 may be the same or different surface materials on the substrate 200. The feature 210 is formed with the bottom 212 being the first surface 250 and the sidewalls 214, 216 and the top surface 220 being the second surface material 260.

A film 230 is formed on the top surface 220 and the walls and bottom of the feature 210. The film 230 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the film 230 is formed by atomic layer deposition or plasma-enhanced atomic layer deposition.

In some embodiments, the film 230 forms conformally on the at least one feature 210. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the film 230 is deposited to a thickness in the range of about 25 Å to about 200 Å, or in the range of about 50 Å to about 150 Å. In one or more embodiments, the film 230 is deposited and there is substantially no seam formed in the film. The formation of the seam occurs where the thickness of the film closes on the top part of the feature 210 before the feature is filled with the film. In some embodiments, the substrate surface has a film with a seam between the sidewalls of the at least one feature. As used in this regard, the term "between" means that there is some film on either side of the seam between the seam and the sidewall of the feature. The seam is not limited to being exactly in the center of the sidewalls.

In some embodiments, the film 230 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the film 230 is formed substantially seamlessly within the feature 210. In some embodiments, a seam may be formed within the width of the feature 210. The seam can be any gap, space or void that forms between the walls 214, 216 of the feature 210.

The film 230 can be any suitable metal containing material. In some embodiments, the film 230 is a metal film. In some embodiments, the film 230 is a metal-containing film. For the purposes of this disclosure and the appended claims, a metal-containing film is any film containing a metal species. A metal-containing film may be comprised of only metal atoms. A metal-containing film may be comprised of metal atoms and other atoms (e.g. oxygen, nitrogen, carbon, boron).

Suitable metal-containing films include derivatives of a metal film. Suitable derivatives of the metal film include, but are not limited to, nitride, boride, carbide, oxynitride, oxyboride, oxycarbide, carbonitride, borocarbide, boronitride, borocarbonitride, borooxycarbonitride, oxycarbonitride, borooxycarbide and borooxynitride. Those skilled in the art will understand that the metal-containing film deposited may have a non-stoichiometric amount of atoms with the metal-containing film.

Those skilled in the art will understand that the metal containing film may have a non-stoichiometric amount of atoms. For example, a film designated as WN may have different amounts of tungsten and nitrogen. The WN film may be, for example, 90 atomic % tungsten. The use of WN to describe a tungsten nitride film means that the film comprises tungsten and nitrogen atoms and should not be taken as limiting the film to a specific composition. In some embodiments, the film consists essentially of the designated atoms. For example, a film consisting essentially of WN means that the composition of the film is greater than or equal to about 95%, 98%, 99% or 99.5% tungsten and nitrogen atoms.

In some embodiments, the film 230 comprises one or more of Co, Mo, W, Ta, Ti, Ru, Rh, Cu, Fe, Mn, V, Nb, Hf, Zr, Y, Al, Sn, Cr, Os, U or La. In some embodiments, the film 230 excludes one or more of Co, Mo, W, Ta, Ti, Ru, Rh, Cu, Fe, Mn, V, Nb, Hf, Zr, Y, Al, Sn, Cr, Os, U and/or La. In some embodiments, the film 230 comprises tungsten. In some embodiments, the film consists essentially of tungsten.

In FIG. 2B, the film 230 is removed from the top surface 220 such that the film 230 is contained entirely within the feature 210. The film 230 can be removed by any suitable etch process. In some embodiments, the film 230 is removed by a chemical-mechanical planarization (CMP) process.

In some embodiments, substantially all of the film 230 is formed within the feature 210. As used in this regard, the term "substantially all" means that greater than or equal to about 95%, 98% or 99% of the film is formed within the feature 210 on a weight basis.

In some embodiments, the film 230 is selectively deposited within the feature 210 and is not deposited on the top surface 220 of the substrate. In these embodiments, the substrate 200 would be processed such that it would flow from FIG. 1 to FIG. 2B without appearing like FIG. 2A. The compositions of the first surface material 250 and the second surface material 260 can be chosen to allow selective deposition of the film 230 on one surface relative to the other.

In some embodiments, the method includes selectively depositing a film 230 within the trench to a height H less than or equal to the depth of the feature 210. In one embodiment, the film 230, fills at least 10% of the volume of the trench. In other embodiments, the film 130 fills at least 15%, 20%, 25%, 30%, 35%, 40%, 45%, 50%, 55%, 60%, 65%, 70%, 75%, 80%, 85%, 90%, 95% or 100% of the volume of the trench. In some embodiments, the film 230 deposited in the feature 210 has a height H that is less than or equal to about 98%, 95%, 90%, 80%, 70%, 60% or 50% of the depth of the feature 210.

As shown in FIG. 2C, the processing method further comprises treating the film 230 to expand the film material volume to provide self-aligned structure 240. The self-aligned structure 240 extends beyond the top surface 220 of the substrate. The self-aligned structure 240 comprises a metal silicide. In this regard, a metal silicide comprises metal atoms and silicon atoms. In some embodiments, the metal silicide of the self-aligned structure 240 may also comprise other atoms. In some embodiments, the self-aligned structure 240 is substantially orthogonal to the top surface 220 of the substrate.

Suitable metals for use in metal-containing films include, but are not limited to metals having a Pilling-Bedworth ratio greater than 2, greater than 2.25, or greater than 2.5. Pilling-Bedworth ratio refers to a ratio of a volume of the elementary cell of the metal silicide to the volume of the elementary cell of the corresponding metal-containing film from which the metal silicide is formed. The Pilling-Bedworth ratio is defined as the $V_{silicide}/V_{metal}$, where V is volume. For determining the Pilling-Bedworth ratio of a metal silicide, $V_{silicide}$ equals the molecular mass of the of the metal silicide multiplied by the density of the metal silicide, and $V_{metal}$ equals the number of atoms of metal per one molecule of the metal silicide multiplied by the atomic mass of the metal multiplied by the density of the metal silicide. Examples of such films include one or more of Co, Mo, W, Ta, Ti, Ru, Rh, Cu, Fe, Mn, V, Nb, Hf, Zr, Y, Al, Sn, Cr, Os, U and/or La. In some embodiments, the metal has a Pilling-Bedworth ratio of greater than 1.5, greater than 1.75, greater than 2.0, greater than 2.25, or greater than 2.5. In some specific embodiments, the metal excludes tungsten.

In some embodiments, the volume of the self-aligned structure is greater than 1.25, greater than 1.5, greater than 1.6, greater than 1.7, greater than 1.75, greater than 1.8, greater than 1.9, greater than 2.0, or greater than 2.5 times the volume of the film. In some embodiments, the volume of the self-aligned structure is less than 3.0, less than 2.5, less than 2.0, less than 1.9, less than 1.8, less than 1.75, less than 1.7, less than 1.6, or less than 1.5 times the volume of the film. In some embodiments, the volume of the self-aligned structure is in the range of greater than 1 to less than 2 times the volume of the film within the feature 210.

The expansion of the film 230 can be in the range of about 10% to about 500%, or in the range of about 25% to about 200%, or in the range of about 50% to about 150%. In some embodiments, the film 230 expands by an amount greater than or equal to about 10%, 20%, 25%, 50% 75% or 100%. In some embodiments, the film 230 expands an amount in the range of about 75% to about 125%. In one or more embodiments, treating the film results in the volume increasing by at least 10%, 20%, 30%, 40%, 50%, 60%, 70%, 80%, 90%, 100%, 150%, 200%, 250%, 300%, 350% or 400%. When a plurality of features is filled with the film 230, a plurality of self-aligned structures 240 can be formed to provide self-aligned structures. In some embodiments, these self-aligned structures can act as a pattern without using a mask.

Treating the film 230 comprises silicidizing the film. In some embodiments, treating the film 230 comprises exposing the film to silicon precursor. A silicon precursor can be any suitable reactant which produces a film comprising metal and silicon. In some embodiments, the silicon precursor comprises one or more of silane, disilane, trisilane, tetrasilane, pentasilane, hexasilane, trimethyl silane, compounds with trimethylsilyl substituents and combinations thereof. In some embodiments, the expansion comprises a thermal silicidizing, plasma enhanced silicidizing, remote plasma siliciizding, microwave and radio-frequency (e.g., ICP, CCP). In some embodiments, the silicon precursor comprises one or more of trimethylsilane, silane, disilane, trisilane, tetrasilane, higher order silane, dichlorosilane, trichlorosilane or trisilylamine. In some embodiments, the film is exposed to a plasma of the silicon precursor.

The silicon precursor may be supplied to the processing chamber at any suitable flow rate depending on, for example, the composition of the film, the silicon precursor, the doping agent, a predetermined rate of expansion or a predetermined amount of volumetric expansion. In some embodiments, the silicon precursor is provided at a flow rate in the range of about 100 sccm to about 2000 sccm. In some embodiments, the silicon precursor is provided at a flow rate of about 500 sccm.

Treating the film 230 can occur at any suitable pressure depending on, for example, the composition of the film, the silicon precursor, the doping agent, a predetermined rate of expansion or a predetermined amount of volumetric expansion. In some embodiments, the film expansion occurs at a pressure in the range of about 1 torr to about 40 torr. In some embodiments, expansion occurs at a pressure greater than or equal to about 1 torr, 5 torr, 10 torr, 20 torr, 25 torr, 30 torr or 35 torr. In some embodiments, expansion occurs at a pressure less than or equal to about 40 torr, 35 torr, 30 torr, 25 torr, 20 torr, 10 torr or 5 torr. In some embodiments, expansion occurs at a pressure of about 5 torr.

In some embodiments, treating the film 230 may utilize a plasma source. Plasma may be generated remotely or within the processing chamber. Plasma may be inductively coupled plasma (ICP) or conductively coupled plasma (CCP). Treatment can occur at any suitable power depending on, for example, the composition of the film, the silicon precursor, the doping agent, a predetermined rate of expansion or a predetermined amount of volumetric expansion. In some embodiments, the film expansion utilizes a plasma power in the range of about 2 kW to about 10 kW. In some embodiments, expansion utilizes a plasma power greater than or equal to about 2 kW, 5 kw, or 8 kW. In some embodiments, expansion utilizes a plasma power less than or equal to about 10 kW, 8 kW, or 5 kW. In some embodiments, expansion utilizes a plasma power of about 10 kW.

In some embodiments, treating the film 230 may utilize a microwave or radio frequency. Treatment can occur at any suitable frequency depending on, for example, the composition of the film, the silicon precursor, the doping agent, a predetermined rate of expansion or a predetermined amount of volumetric expansion. In some embodiments, the film expansion utilizes a frequency in the range of about 2 MHz to about 100 MHz. In some embodiments, expansion utilizes a frequency greater than or equal to about 2 MHz, 5 MHz, 10 MHz, 13.56 MHz, 25 MHz, 30 MHz, 40 MHz, 50 MHz, 60 MHz, 75 MHz, or 100 MHz. In some embodiments, expansion utilizes a frequency less than or equal to about 100 MHz, 90 MHz, 75 MHz, 50 MHz, 40 MHz, 30 MHz, 25 MHz, 10 MHz, or 5 MHz. In some embodiments, expansion utilizes a frequency of about 13.56 MHz.

In some embodiments, the film is treated with a doping agent to form a doped metal silicide. In some embodiments, the film is exposed to the doping agent before being exposed to a silicon precursor. In some embodiments, the film is exposed to the doping agent after being exposed to a silicon precursor. In some embodiments, the film is exposed to the doping agent simultaneous to being exposed to a silicon precursor.

In some embodiments, the doped metal silicide comprises carbon (MSiC), nitrogen (MSiN) or oxygen (MSiO). In some embodiments, the doping agent comprises ethyne or ethane and the doped metal silicide is a metal carbosilicide (MSiC). In some embodiments, the doping agent comprises ammonia or a mixture of nitrogen and hydrogen gases and the doped metal silicide is a metal nitrosilicide (MSiN). In some embodiments, the doping agent comprises oxygen and the doped metal silicide is a metal oxysilicide (MSiO).

Treating the film 230 can occur at any suitable temperature depending on, for example, the composition of the film, the silicon precursor, the doping agent, a predetermined rate of expansion or a predetermined amount of volumetric expansion. In some embodiments, the film expansion occurs at a temperature in the range of about 200° C. to about 600° C. In some embodiments, expansion occurs at a temperature greater than or equal to about 200° C., 300° C., 350° C., 400° C., 450° C., 500° C. or 550° C. In some embodiments, expansion occurs at a temperature less than or equal to about 600° C., 500° C., 450° C., 400° C., 350° C., 300° C. or 250° C.

In some embodiments, the rate of expansion of the film to form the self-aligned structure is controlled. In some embodiments, the quantity of expansion is controlled.

In some embodiments, the rate or quantity of expansion is controlled by co-flowing hydrogen gas with the silicon precursor. Without being bound by theory, it is believed that exposing the substrate to hydrogen gas slows the reaction by promoting a competing reverse reaction and/or shifting the equilibrium of the reaction by introducing a reaction product.

The hydrogen gas may be supplied to the processing chamber at any suitable flow rate depending on, for example, the composition of the film, the silicon precursor, the doping agent, a predetermined rate of expansion or a predetermined amount of volumetric expansion. In some embodiments, the hydrogen gas is provided at a flow rate in the range of greater than 0 sccm to about 5000 sccm. In some embodiments, the hydrogen gas is provided at a flow rate of about 1000 sccm.

In some embodiments, the rate or quantity of expansion is controlled by exposing the self-aligned structure to a hydrogen plasma source. Without being bound by theory, it is believed that the hydrogen plasma removes silicon atoms from the self-aligned structure and returns the volume of the self-aligned structure towards the volume of the film before expansion.

As shown in FIG. 2C, during expansion, the fidelity of the feature shape is maintained on the top of the feature so that the film 230 grows straight up from the feature 210. As used in this regard, "straight up" means that the sides of the expanded film 240 are substantially coplanar with the sidewall 214, 216 of the feature 210. A surface is coplanar with the sidewall 214 where the angle formed at the junction of the sidewall 214 and the surface is ±10°. In this regard, an expanded film which extends "straight up" from the feature may be described as orthogonal to the top surface of the substrate if the sidewalls are perpendicular to the top surface.

In some embodiments, after forming the self-aligned structure, a material is deposited around the self-aligned structure and the self-aligned structure is removed to form a self-aligned via. The deposited material can be any suitable material. In some embodiments, the deposited material is a dielectric material. In some embodiments, the deposited material is the same as the first surface material 250. In some embodiments, the deposited material is an inter-layer dielectric (ILD).

In some embodiments, the self-aligned structure is removed by exposing the self-aligned structure to an etchant. In some embodiments, the etchant is a metal halide etchant. In some embodiments, the etchant comprises $WCl_5$. In some embodiments, the etchant is a metal fluoride etchant. In some embodiments, the etchant comprises $WF_6$. In some embodiments, the self-aligned structure is removed by exposing the structure to both an etchant and hydrogen plasma.

Some embodiments include an optional treatment process. The treatment process treats the film 230 to improve some parameter of the film. In some embodiments, the treatment process comprises annealing the film. In some embodiments, treatment can be performed by in-situ anneal in the same process chamber used for deposition and/or oxidation. Suitable annealing processes include, but are not limited to, rapid thermal processing (RTP) or rapid thermal anneal (RTA), spike anneal, or UV cure, or e-beam cure and/or laser anneal. The anneal temperature can be in the range of about 500° C. to 900° C. The composition of the environment during anneal may include one or more of $H_2$, Ar, He, $N_2$, $NH_3$, $SiH_4$, etc. The pressure during anneal can be in the range of about 100 mTorr to about 1 atm.

According to one or more embodiments, the substrate is subjected to processing prior to and/or after forming the layer 230 or the self-aligned structure 240. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. The exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While processes may be referred to as oxidation, those skilled in the art will understand that the disclosure is not limited to oxidation reactions to expand the film. The use of the oxidation reaction to describe various embodiments is for convenience only and is not limiting of the scope of the disclosure.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method for producing a self-aligned structure, the method comprising:
   providing a substrate with a substrate surface with at least one feature formed therein, the at least one feature extending a distance into the substrate from the substrate surface and having a sidewall and bottom;
   forming a metal-containing film in the at least one feature and not outside the at least one feature;
   exposing the metal-containing film to a silicon precursor to form a self-aligned structure of metal silicide that expands from the at least one feature; and
   depositing a material around the self-aligned structure and removing the self-aligned structure to form a self-aligned via.

2. The method of claim 1, wherein the self-aligned structure has a volume in the range of greater than 1 to less than 2 times the volume of the metal-containing film within the feature.

3. The method of claim 1, wherein forming the metal-containing film within the at least one feature comprises forming a metal-containing film on the substrate surface and within the at least one feature and removing the metal-containing film from the substrate surface outside of the at least one feature.

4. The method of claim 1, wherein the self-aligned structure is substantially orthogonal to the substrate surface.

5. The method of claim 1, wherein the metal-containing film comprises one or more of Co, Mo, W, Ta, Ti, Ru, Rh, Cu, Fe, Mn, V, Nb, Hf, Zr, Y, Al, Sn, Cr, Os, U or La.

6. The method of claim 5, wherein the metal-containing film consists essentially of W.

7. The method of claim 1, wherein a plasma of the silicon precursor is exposed to metal-containing film.

8. The method of claim 1, wherein the silicon precursor comprises one or more of trimethylsilane, silane, disilane, dichlorosilane, trichlorosilane or trisilylamine.

9. The method of claim 1, further comprising exposing the metal-containing film to a doping agent to form a doped metal silicide.

10. The method of claim 9, wherein the doped metal silicide comprises carbon, nitrogen, or oxygen.

11. The method of claim 10, wherein the self-aligned structure comprises a metal carbosilicide (MSiC) and the doping agent comprises ethyne or ethane.

12. The method of claim 10, wherein the self-aligned structure comprises a metal nitrosilicide (MSiN) and the doping agent comprises one or more of ammonia or nitrogen.

13. The method of claim 10, wherein the self-aligned structure comprises a metal oxysilicide (MSiO) and the doping agent comprises an oxygen-containing precursor.

14. The method of claim 1, wherein the rate of formation of the self-aligned structure is controlled by exposing the substrate to hydrogen during silicidation.

15. The method of claim 1, further comprising reducing the volume of the self-aligned structures by exposing the self-aligned structures to a hydrogen plasma.

16. The method of claim 1, wherein silicidizing the metal-containing film occurs at a temperature in a range of greater than or equal to about 200° C. and less than or equal to about 600° C.

17. The method of claim 1, wherein the self-aligned structure is removed by a exposing the self-aligned structure to a metal fluoride etchant.

18. A method for producing a self-aligned structure, the method comprising:
providing a substrate with a substrate surface with at least one feature formed therein, the at least one feature extending a distance into the substrate from the substrate surface and having a sidewall and bottom;
forming a tungsten film on the substrate surface and in the at least one feature;
removing the tungsten film from the substrate surface outside of the at least one feature; and
exposing the tungsten film to a silicon precursor and hydrogen to form a self-aligned structure of tungsten silicide that expands from the at least one feature at a predetermined rate, the self-aligned structure having a volume of about two times the tungsten film within the feature.

19. A method for producing a self-aligned via, the method comprising:
providing a substrate with a substrate surface with at least one feature formed therein, the at least one feature extending a distance into the substrate from the substrate surface and having a sidewall and bottom;
forming a tungsten film on the substrate surface and in the at least one feature;
removing the tungsten film from the substrate surface outside of the at least one feature;
exposing the tungsten film to a silicon precursor to form a self-aligned structure of tungsten silicide that expands from the at least one feature at a predetermined rate;
depositing a material around the self-aligned structure; and
exposing the self-aligned structure to a hydrogen plasma and an etchant to remove the self-aligned structure and form a self-aligned via.

* * * * *